United States Patent
Goma et al.

[11] Patent Number: 5,534,825
[45] Date of Patent: Jul. 9, 1996

[54] VOLAGE-CONTROLLED OSCILLATION CIRCUIT WITH AN IMPEDANCE ELEMENT FOR CARRIER-TO-NOISE COMPENSATION

[75] Inventors: Shinji Goma; Tatsuo Bizen, both of Kyoto, Japan

[73] Assignee: Murata Manufacturing Co., Ltd., Japan

[21] Appl. No.: 431,409

[22] Filed: Apr. 28, 1995

Related U.S. Application Data

[63] Continuation of Ser. No. 172,551, Dec. 23, 1993, abandoned.

[30] Foreign Application Priority Data

Dec. 25, 1992  [JP]  Japan ..................................... 4-346496

[51] Int. Cl.⁶ ...................................................... H03B 5/12
[52] U.S. Cl. .................... 331/117 R; 331/177 V
[58] Field of Search .................... 331/117 R, 117 FE, 331/177 V, 177 R, 36 C

[56] References Cited

U.S. PATENT DOCUMENTS 3,400,338  9/1968  Ishman ................................. 331/177 V

FOREIGN PATENT DOCUMENTS 0171529  2/1986  European Pat. Off. .

Primary Examiner—Siegfried H. Grimm
Attorney, Agent, or Firm—Ostrolenk, Faber, Gerb & Soffen

[57] ABSTRACT

In a voltage-controlled oscillation circuit, a parallel resonance circuit which is formed by connecting a coil (an inductive element) and a capacitor (a capacitive element) in parallel with each other is provided between a control terminal and a resonance circuit. A control voltage is inputted at the control terminal and is supplied to the resonance circuit through the parallel resonance circuit, so that the resonance frequency of the resonance circuit is responsive to the control voltage; an oscillation stage of the voltage-controlled oscillation circuit oscillates at that resonance frequency. The oscillation output of the oscillation stage is outputted at an output terminal from a buffer stage through an output matching stage.

2 Claims, 4 Drawing Sheets

VOLAGE-CONTROLLED OSCILLATION CIRCUIT WITH AN IMPEDANCE ELEMENT FOR CARRIER-TO-NOISE COMPENSATION

This is a Continuation of application Ser. No. 08/172,551 filed on Dec. 23, 1993 and now abandoned.

BACKGROUND OF THE INVENTION

1. Field of the Invention

The present invention relates to a voltage-controlled oscillation circuit (hereinafter referred to as VCO). More specifically, the present invention relates to a VCO, which is supplied with a control voltage for controlling its oscillation frequency through an impedance element for C-N characteristic (carrier-to-noise ratio) compensation.

2. Description of the Background Art

FIG. 1 is a circuit diagram showing an example of a conventional VCO 1. Referring to FIG. 1, the VCO 1 includes an oscillation stage 4, a buffer stage 5 and an output matching stage 6. The oscillation frequency of the oscillation stage 4 is changed in response to a control voltage Vc which is applied to a control terminal C. The buffer stage 5 prevents the oscillation frequency of the oscillation stage 4 from varying with load fluctuation. The output matching stage 6 attains matching with a next-stage circuit which is connected with an output terminal P, and suppresses higher harmonics.

The oscillation stage 4 includes a resonance circuit 7. This resonance circuit 7 includes a frequency variable varactor diode VD, a coupling capacitor C11 and a resonance inductor L2, and the control terminal C supplies the control voltage Vc to a cathode of the frequency variable varactor diode VD and an end of the coupling capacitor C11 through an impedance element Zvc for C-N characteristic compensation having a line impedance. An anode of the frequency variable varactor diode VD is grounded, while another end of the coupling capacitor C11 is connected to an end of the resonance inductor L2 and an end of the coupling capacitor C10. Another end of the resonance inductor L2 is grounded.

The oscillation stage 4 includes an oscillation transistor Q2, and another end of the coupling capacitor C10 is connected to its base. Further, the base of the oscillation transistor Q2 is supplied with a voltage, which is obtained by dividing a power supply voltage $V_B$ by bias resistors R4 and R5 serially connected between a power supply terminal B and the ground, as a bias voltage. A capacitor C9 is connected between a base and an emitter of the oscillation transistor Q2, while a resistor R6 and a capacitor C8 are connected in parallel between the emitter of the oscillation transistor Q2 and the ground.

The capacitors C9 and C8 form a Colpitts capacitance, and the oscillation transistor Q2 forms a Colpitts oscillator with the capacitors C9 and C8 and the resonance inductor L2, to oscillate at the resonance frequency of the resonance circuit 7.

An oscillation output of the oscillation stage 4 is supplied to the buffer stage 5 through the coupling capacitor C7. The buffer stage 5 includes a buffer transistor Q1, which is supplied with the oscillation output of the oscillation stage 4 in its base. The base of the buffer transistor Q1 is also supplied with a voltage, which is obtained by dividing the power supply voltage $V_B$ by bias resistors R1 and R2 connected in series between the power supply terminal B and the ground, as a bias voltage. A collector of the buffer transistor Q1 is connected to the power supply terminal B through a choke coil L1 which is included in the output matching stage 6.

The output matching stage 6 includes the choke coil L1, a coupling capacitor C1 and an output matching capacitor C2. An end of the coupling capacitor C1 is connected to the collector of the buffer transistor Q1, while another end thereof is connected to the output terminal. On the other hand, an end of the output matching capacitor C2 is connected to the output terminal P, while another end thereof is grounded. A high frequency bypass capacitor C5 is connected between the power supply terminal B and the ground, while another high frequency bypass capacitor C3 is connected between the control terminal C and the ground.

In the VCO 1 having the structure shown in FIG. 1, the capacitance of the frequency variable varactor diode VD included in the resonance circuit 7 is changed in response to the control voltage Vc which is inputted through the impedance element Zvc for C-N characteristic compensation. The resonance circuit 7 resonates on the basis of the coupling capacitor C11, the capacitance of the frequency variable varactor diode VD, and the resonance inductor L2, while the oscillation transistor Q2 oscillates at the resonance frequency thereof. The oscillation output is supplied to the base of the buffer transistor Q1 through the coupling capacitor C7, so that the collector of the buffer transistor Q1 outputs the oscillation output, which in turn is outputted from the output terminal P through the coupling capacitor C1.

In such a VCO, the impedance element Zvc for C-N characteristic compensation is generally connected between the control terminal C and the resonance circuit 7. This impedance element Zvc is formed by an inductive or resistive element to protect the quality factor of the resonance circuit 7 from damping caused by the control voltage Vc, thereby maintaining excellent C-N characteristics. It is possible to attain excellent C-N characteristics when this impedance element Zvc has a high line impedance.

In a miniature VCO which is employed in a cordless telephone, a portable telephone or a pager, the aforementioned impedance element Zvc is mainly formed by a coil, a transmission line such as a stripline, or a resistive element. When a resistive element is employed as the impedance element Zvc, however, the C-N characteristics of the VCO are deteriorated due to the influence of thermal noise. Therefore, the impedance element Zvc is preferably formed by an inductive element.

In order to attain a high impedance when the impedance element Zvc is formed by an inductance element, however, a coil having a large feature size or a stripline which is formed in a wide area is required and hence the VCO cannot be miniaturized.

SUMMARY OF THE INVENTION

Accordingly, a principal object of the present invention is to provide a VCO whose C-N characteristics can be improved with no increase in size, while employing an inductive element as an impedance element.

Briefly stated, the present invention is directed to a voltage-controlled oscillation circuit which is supplied with a control voltage for controlling its oscillation frequency through an impedance element for C-N characteristic compensation. The impedance element includes a parallel resonance circuit which is formed by connecting an inductive element and a capacitive element in parallel with each other.

According to the present invention, therefore, it is possible to employ the maximum impedance in the parallel resonance circuit as a line impedance. Thus, an inductive element having a small impedance such as a coil having a small feature size or a stripline having a narrow area can be used to provide the line impedance, whereby the C-N characteristics can be improved without increasing the VCO in size.

In a further preferable embodiment of the present invention, a resistive element is connected in parallel with the inductive element and the capacitive element forming the parallel resonance circuit, to adjust the resonance frequency.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
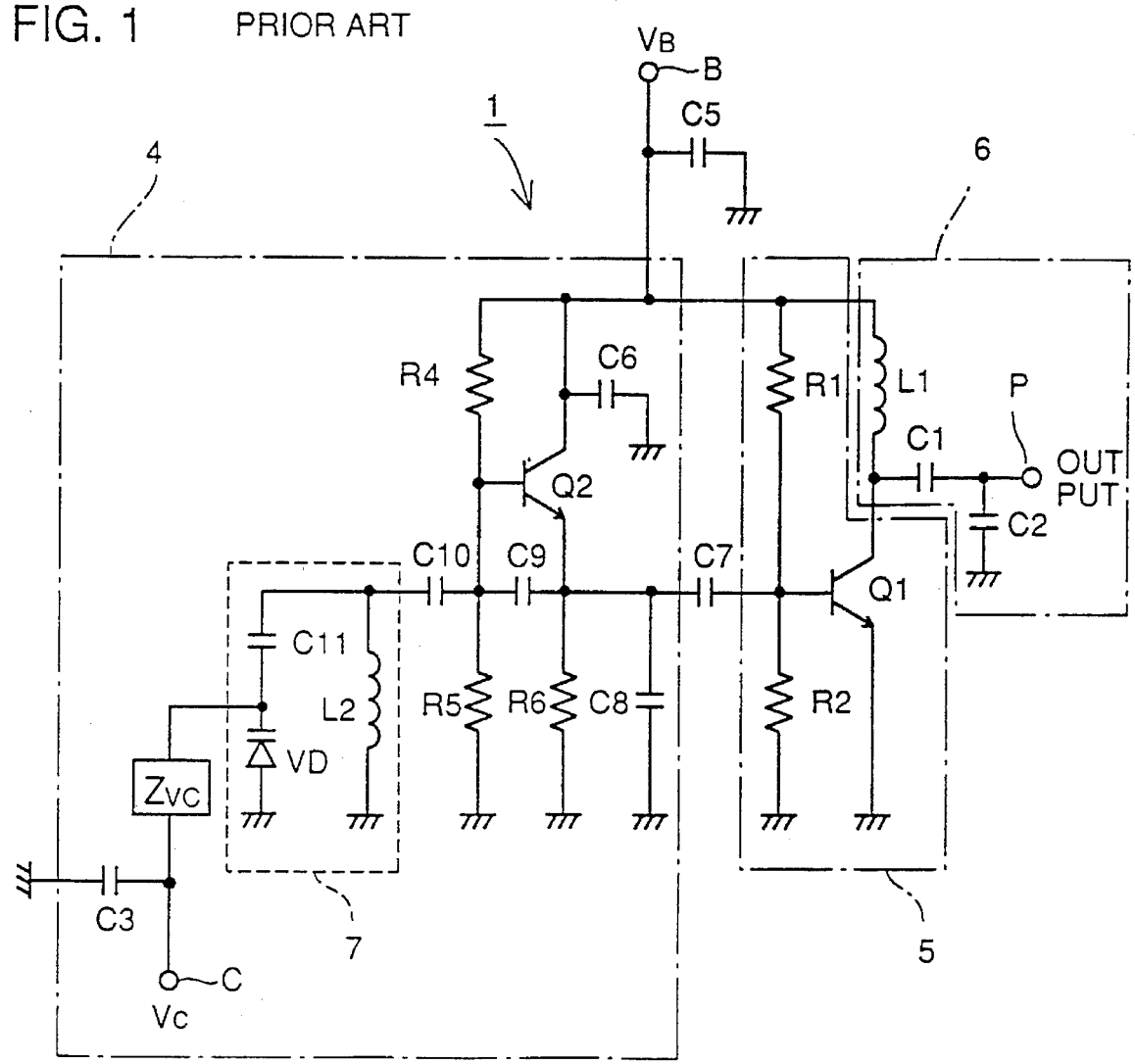
FIG. 1 is an electric circuit diagram showing an example of a conventional VCO.
Figure 2:
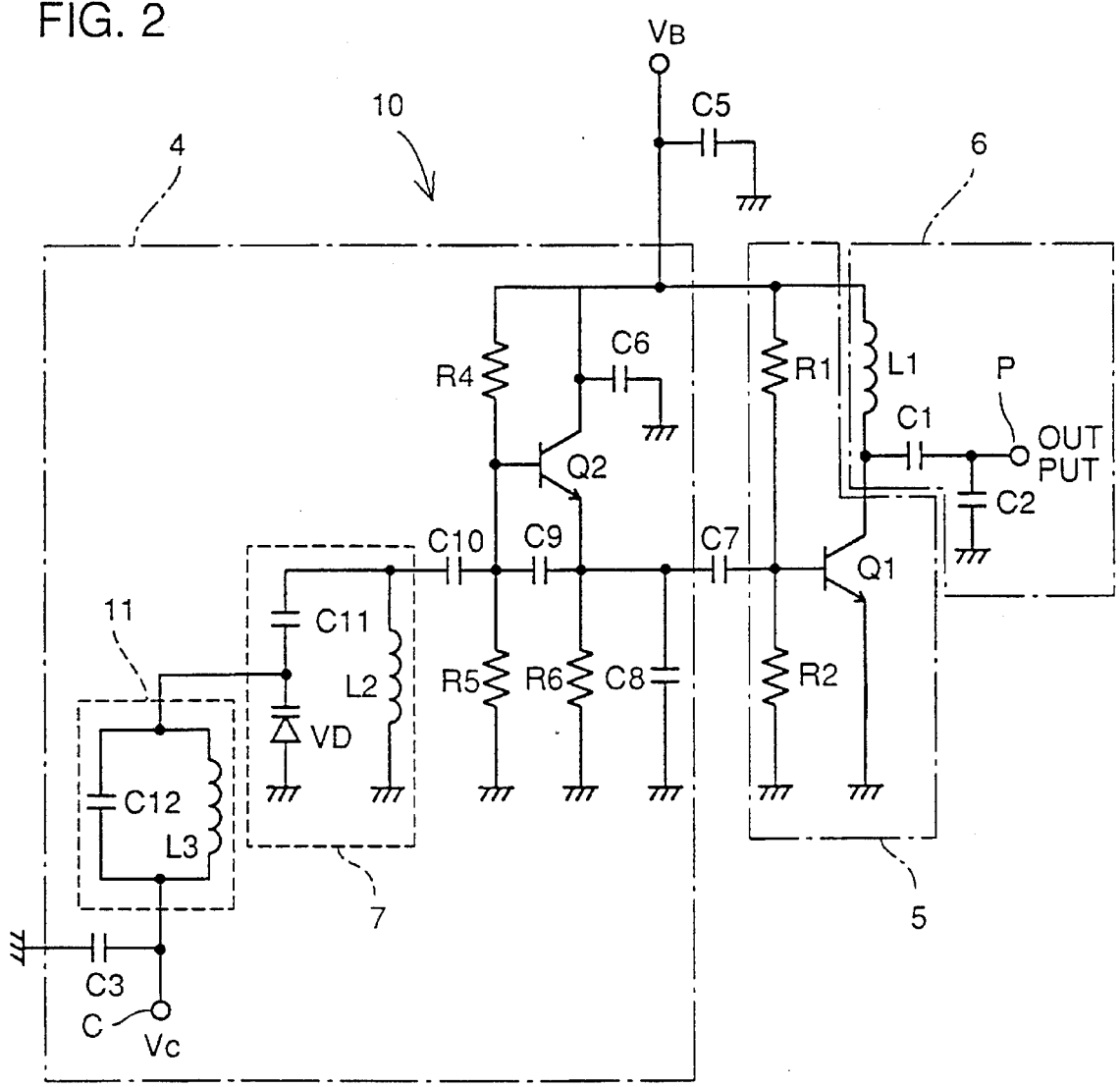
FIG. 2 is an electric circuit diagram showing an embodiment of the present invention.

FIG. 2 is an electric circuit diagram showing a VCO 10 according to an embodiment of the present invention. In the embodiment shown in FIG. 2, a parallel circuit 11 which is formed by a coil L3 of an inductive element and a capacitor C12 of a capacitive element is connected between a control terminal C and a resonance circuit 7 for serving as an impedance element for C-N characteristic compensation. The remaining structure of this embodiment is identical to that shown in FIG. 1. The resonance frequency of the parallel resonance circuit 11 is selected to be substantially equal to that of the resonance circuit 7 provided in an oscillation stage 4.

Figure 3:
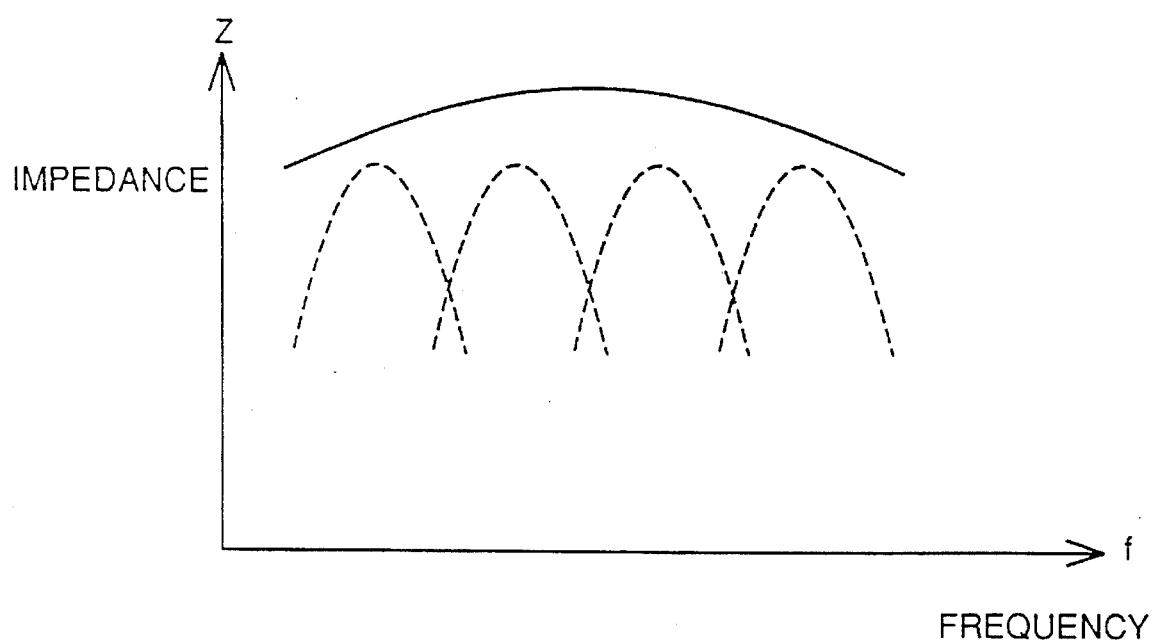
FIG. 3 illustrates resonance characteristics of the embodiment shown in FIG. 2.

FIG. 3 illustrates resonance characteristics of the VCO 10 shown in FIG. 2. The resonance frequency of the resonance circuit 7 is changed in response to a control voltage as clearly understood from the resonance characteristics of the resonance circuit 7 shown by dotted lines in FIG. 3. In order to cope with this change, the quality factor of the parallel resonance circuit 11 is so reduced that the same has a flat resonance characteristic as shown by a solid line in FIG. 3. Thus, it is possible to employ an inductive element having a small impedance such as a coil having a small feature size or a stripline having a narrow area by employing an impedance at the resonance frequency of the parallel resonance circuit 11 as the line impedance, thereby improving the C-N characteristics without increasing the VCO 10 in size.

According to an experiment made by the inventors, it was possible to confirm improvement of C-N characteristics by 4.4 dB in a sample of the embodiment shown in FIG. 2 employing a parallel resonance circuit 11 which was formed by a coil L3 of 0.33 μH and a capacitor C12 of 22 pF for serving as a line impedance Zvc for C-N characteristic compensation, as compared with a conventional sample employing only a coil L of 0.33 μH.

Figure 4:
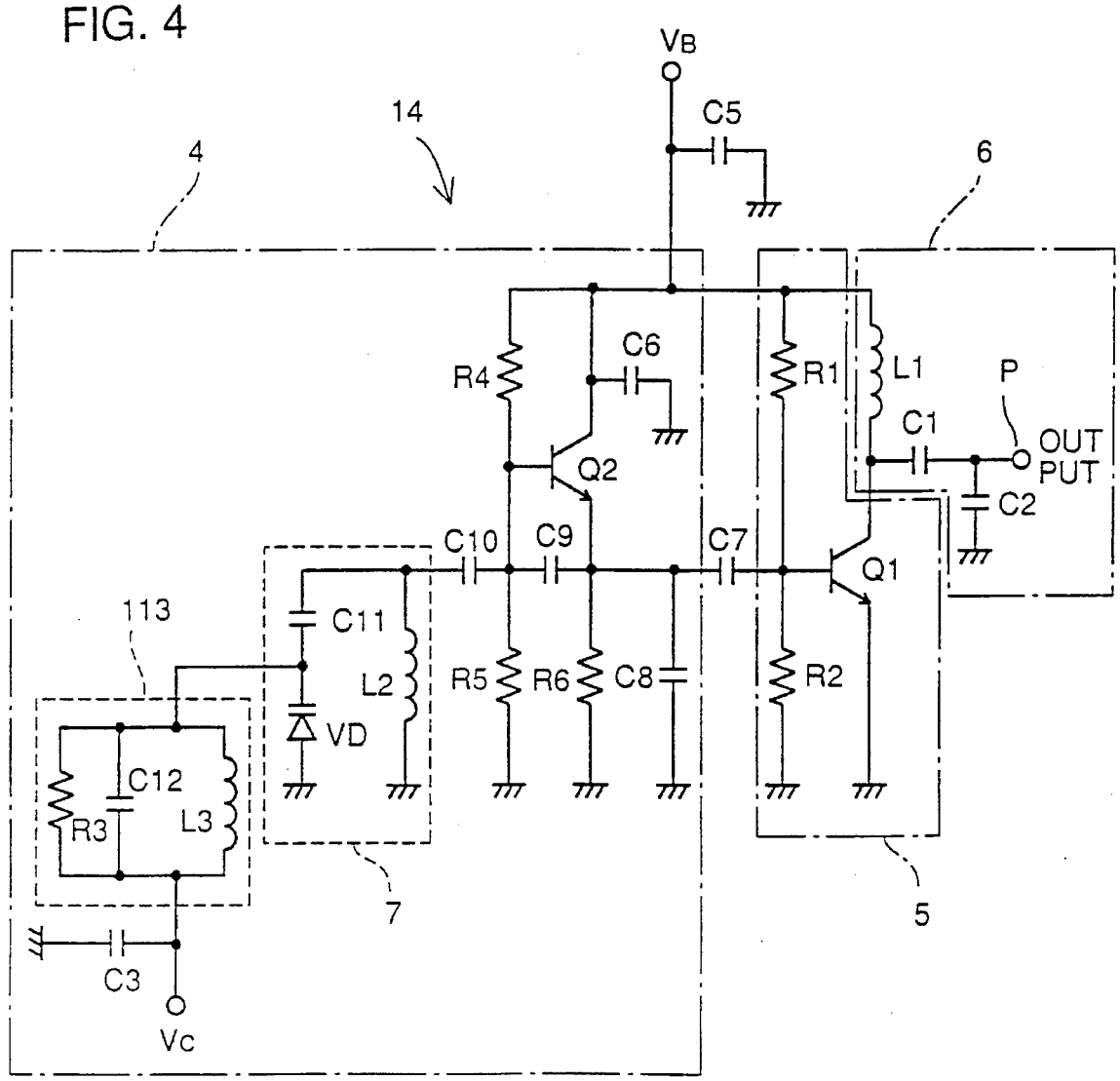
FIG. 4 is an electric circuit diagram showing a further embodiment of the present invention.

FIG. 4 is an electric circuit diagram showing a VCO 14 according to a further embodiment of the present invention. In the embodiment shown in FIG. 4, a resistor R3 is connected in parallel with a circuit corresponding to the parallel resonance circuit 11 shown in FIG. 2 for further flattening its resonance characteristics. The remaining structure of this embodiment is similar to that shown in FIG. 2. Thus, the resistor R3 is connected in parallel with a coil L3 and a capacitor C12 to form a parallel resonance circuit 113, whereby it is possible to reduce the quality factor of the parallel resonance circuit 113 and flatten its resonance characteristics, thereby attaining a high impedance in a wide frequency band.

In the aforementioned embodiments, circuit parts other than the parallel resonance circuits 11, 111, 112 and 113 are arbitrarily changeable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage-controlled oscillation circuit comprising:

an oscillation transistor;

a resonance circuit connected to said oscillation transistor for controlling an oscillation frequency thereof, said resonance circuit having a resonance frequency;

a control terminal for receiving a control voltage for controlling said resonance frequency of said resonance circuit;

said resonance circuit consisting of a variable-capacitance diode having a cathode which is connected to said impedance circuit so as to receive said control voltage from said control terminal via said impedance circuit for controlling said resonance frequency of said resonance circuit, and a grounded anode;

an inductor having a first end which delivers an output of said resonance circuit to said oscillation transistor, and a second end which is grounded; and a capacitor connected between said cathode of said variable-capacitance diode and said first end of said inductor; and a parallel impedance circuit interconnecting the control terminal and the resonance circuit, said parallel impedance circuit consisting of a single fixed capacitor in parallel with a single stripline inductor;

said resonance frequency of said resonance circuit being substantially equal to a resonance frequency of said parallel impedance circuit and said parallel impedance circuit having a substantially flat resonance characteristic.

2. A voltage-controlled oscillation circuit as claimed in claim 1, wherein said parallel impedance circuit further consists of a resistor in parallel with the capacitor and the inductor, for further flattening the resonance characteristic of the parallel impedance circuit by reducing the quality factor of the parallel impedance circuit.

\* \* \* \* \*